United States Patent [19]

Ookubo

[11] Patent Number: 5,543,355
[45] Date of Patent: Aug. 6, 1996

[54] METHOD FOR MANUFACTURING SEMICONDUCTOR LASER DEVICE HAVING CURRENT BLOCKING LAYERS

[75] Inventor: Mitsuyoshi Ookubo, Shiga, Japan

[73] Assignee: NEC Corporation, Tokyo, Japan

[21] Appl. No.: 422,853

[22] Filed: Apr. 17, 1995

[30] Foreign Application Priority Data

Apr. 18, 1994 [JP] Japan .................................. 6-78270

[51] Int. Cl.$^6$ .................................................. H01L 21/20
[52] U.S. Cl. .................................... 437/129; 148/DIG. 95
[58] Field of Search ...................... 437/129; 148/DIG. 95

[56] References Cited

U.S. PATENT DOCUMENTS

| | | | |
|---|---|---|---|
| 4,759,023 | 7/1988 | Yamaguchi | 437/129 |
| 4,902,644 | 2/1990 | Wilt | 437/129 |
| 5,278,858 | 1/1994 | Brillouet et al. | 437/129 |
| 5,376,583 | 12/1994 | Northrup et al. | 437/129 |

FOREIGN PATENT DOCUMENTS

| | | | |
|---|---|---|---|
| 373637 | 6/1990 | European Pat. Off. | 437/129 |
| 67680 | 4/1984 | Japan | 437/129 |
| 72788 | 4/1984 | Japan | 437/129 |
| 92591 | 5/1984 | Japan | 437/129 |
| 117286 | 7/1984 | Japan | 437/129 |
| 48409 | 9/1984 | Japan | 437/129 |
| 208886 | 9/1986 | Japan . | |
| 74790 | 3/1989 | Japan . | |
| 105489 | 4/1990 | Japan . | |

*Primary Examiner*—R. Bruce Brenemann
*Assistant Examiner*—Linda J. Fleck
*Attorney, Agent, or Firm*—Foley & Lardner

[57] ABSTRACT

In a method for manufacturing a semiconductor laser device, striped grooves are formed in a compound semiconductor substrate (or crystal element) on both sides of a light emission area. Then, the compound semiconductor substrate on both outer sides of the striped grooves is etched, so that the compound semiconductor substrate is lower than at both outer sides of the striped grooves than at the light emission area. Then, Current blocking layers are buried in the compound semiconductor substrate except for the light emission area.

10 Claims, 8 Drawing Sheets

METHOD FOR MANUFACTURING SEMICONDUCTOR LASER DEVICE HAVING CURRENT BLOCKING LAYERS

BACKGROUND OF THE INVENTION

1. Field of the Invention

The present invention relates to a method for manufacturing a semiconductor laser device which can be used in an optical communication system, a bar code reader, and the like.

2. Description of the Related Art

In a prior art method for manufacturing a laser semiconductor device, an N-type cladding layer, an active layer, and a P-type cladding layer are grown by a liquid phase epitaxial (LPE) growth method on an N-type substrate. Then, striped grooves are formed in the N-type cladding layer, the active layer and the P-type cladding layer on both sides of a light emission area. Then, a P-type layer and an N-type layer are buried in the P-type cladding layer except for the light emission area, to prevent a current from flowing therethrough. This increases a current flowing through the active layer. This will be explained later in detail.

In the prior art manufacturing method, however, the P-type layer and the N-type layer acting as current blocking layers are so thin at the outer edges of the striped grooves that the current blocking layers are disconnected therein. This invites a leakage current. Also, the resistance of the current blocking layers is reduced, which reduces the current flowing through the active layer. Thus, the prior art manufacturing method reduces the reliability of operation, thus reducing the manufacturing yield of semiconductor laser devices.

SUMMARY OF THE INVENTION

It is an object of the present invention to provide a method for manufacturing a semiconductor laser device which can improve the reliability of operation of the semiconductor laser device to increase the manufacturing yield threrof.

According to the present invention, in a method for manufacturing a semiconductor laser device, striped grooves are formed in a compound semiconductor substrate (or crystal element) on both sides of a light emission area. Then, the compound semiconductor substrate on both outer sides of the striped grooves is etched, so that the compound semiconductor substrate is lower than at both the outer sides of the striped grooves than at the light emission area. Then, current blocking layers are buried in the compound semiconductor substrate except for the light emission area.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, a prior art method for manufacturing a semiconductor laser device will be explained with reference to FIGS. 1A through 1F.

Figure 1A:
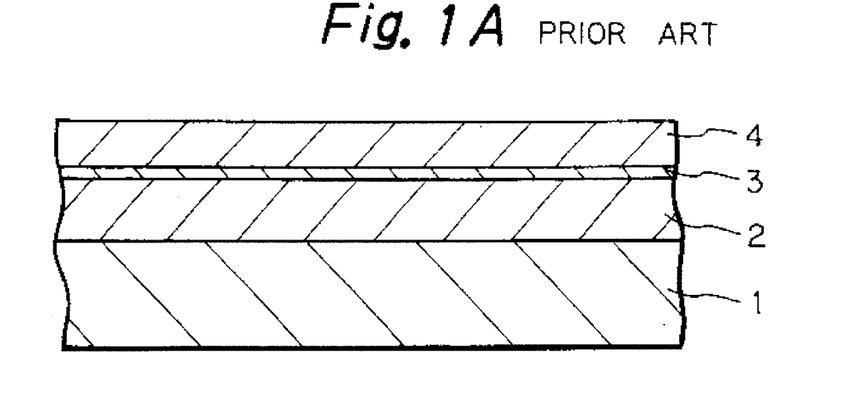
FIGS. 1A through 1F are cross-sectional views explaining a prior art method for manufacturing a semiconductor laser device.

First, referring to FIG. 1A, an N-type InP cladding layer 2, an InGaAsP active layer 3 and a P-type InP cladding layer 4 are formed by an LPE method on an N-type InP substrate 1. Together the N-type InP substrate 1, the N-type InP cladding layer 2, the InGaAsP active layer 3 and the P-type InP cladding layer 4 form a compound semiconductor crystal.

Figure 1B:
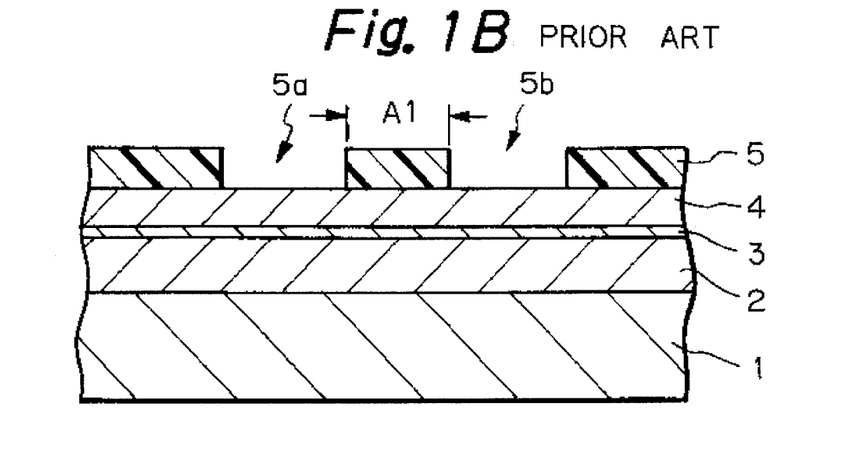

Next, referring to FIG. 1B, a photoresist layer 5 is formed on the entire surface. Then, the photoresist layer 5 is patterned by a photolithography process to create windows 5a and 5b at both sides of a light emission area A1.

Figure 1C:
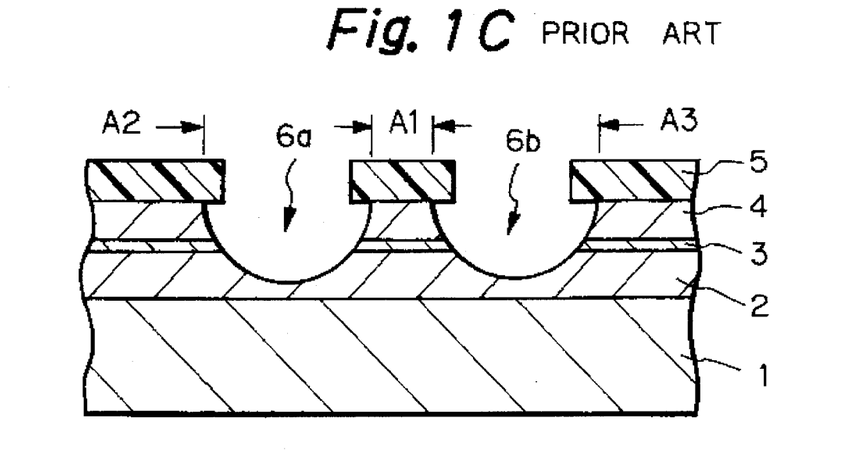
Figure 1D:
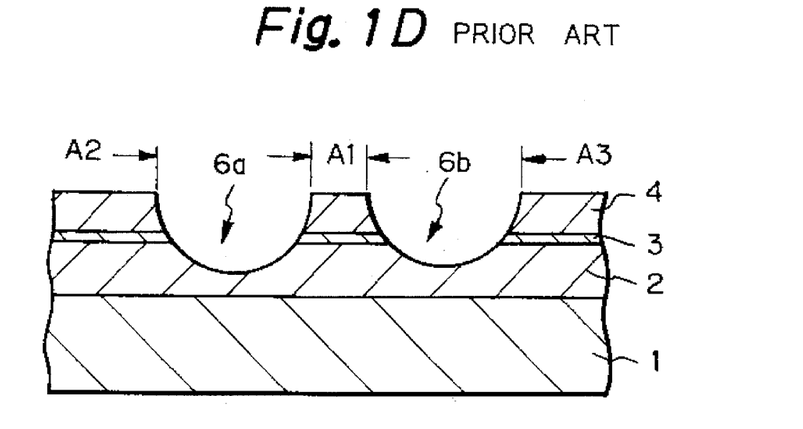

Next, referring to FIG. 1C, the P-type InP cladding layer 4, the active layer 3 and the N-type InP cladding layer 2 are etched by an etchant including $H_2SO_4$ or HCl with a mask of the patterned photoresist layer 5. As a result, striped grooves 6a and 6b are formed within the compound semiconductor crystal. Then, the photoresist layer 4 is removed by a plasma ashing or a wet process. Thus, as shown in FIG. 1D, the light emission area A1 is separated from outer edge areas A2 and A3.

Figure 1E:
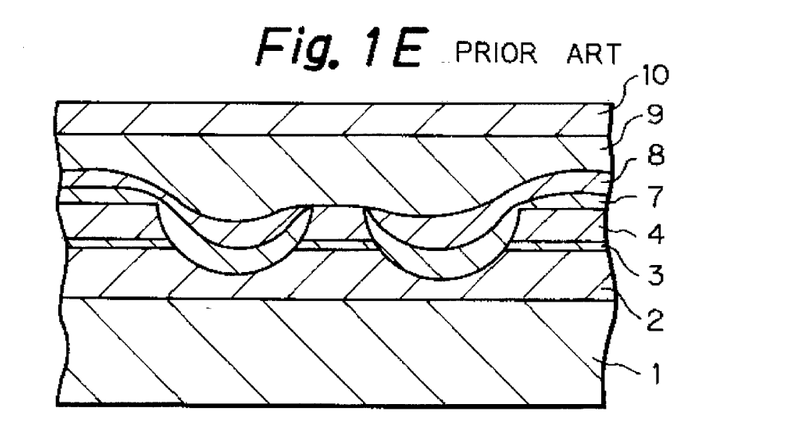

Next, referring to FIG. 1E, a P-type InP current blocking layer 7, an N-type InP current blocking layer 8, a P-type upper cladding layer 9 and a P-type InGaAsP cap layer 10 are grown by an LPE method.

Figure 1F:
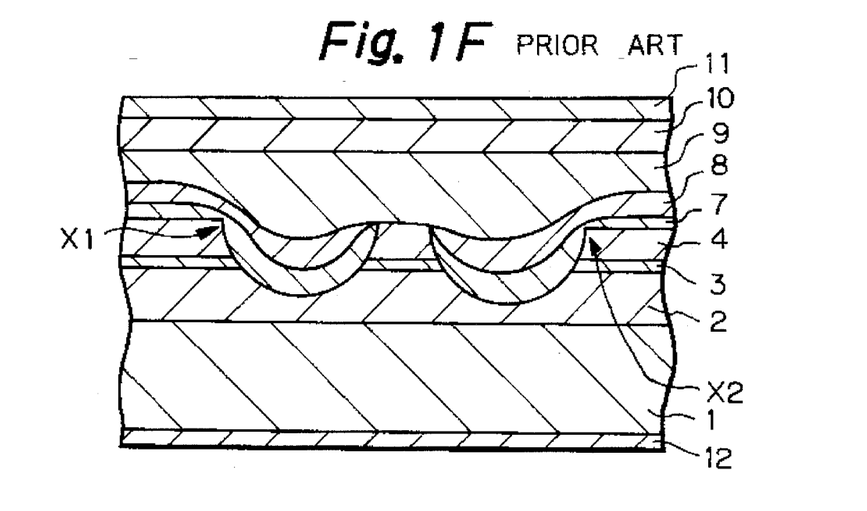

Finally, referring to FIG. 1F, a P-side electrode 11 and an N-side electrode 12 are formed on the front and back surfaces, respectively.

In the prior art manufacturing method as shown in FIGS. 1A through 1F, however, as stated above, the P-type InP current blocking layer 7 and the N-type InP current blocking layer 8 are so thin at the outer edges of the striped grooves as indicated by arrows X1 and X2 in FIG. 1F that the current blocking layers 7 and 8 are disconnected therein. This invites a leakage current. Also, the resistance of the current blocking layers 7 and 8 is reduced, which reduces the current flowing through the active layer 3. Thus, the prior art manufacturing method as shown in FIGS. 1A through 1F reduces the reliability of operation, which reduces the manufacturing yield of semiconductor laser devices.

FIGS. 2A through 2I show a first embodiment of the present invention.

Figure 2A:
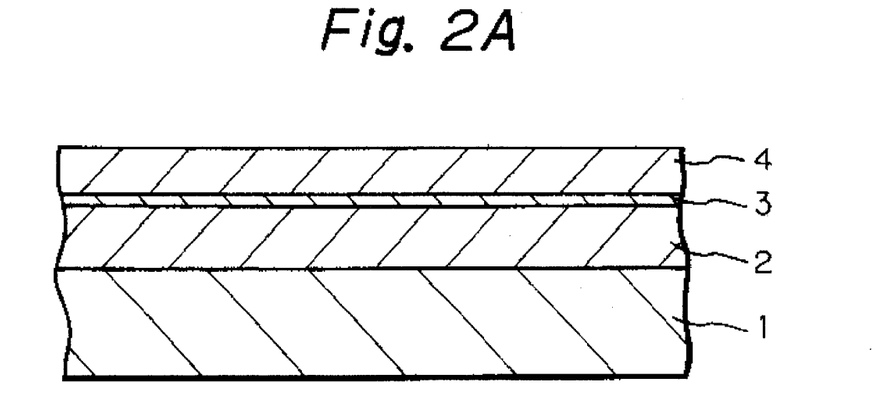
FIGS. 2A through 2I are cross-sectional views explaining a method for manufacturing a first embodiment of the semiconductor laser device according to the present invention.

First, referring to FIG. 2A, in the same way as in FIG. 1A, an N-type InP cladding layer 2, an InGaAsP active layer 3 and a P-type InP cladding layer 4 are formed by an LPE method on an N-type InP substrate 1. Togetherthe N-type InP substrate 1, the N-type InP cladding layer 2, the InGaAsP active layer 3 and the P-type InP cladding layer 4 form a compound semiconductor crystal.

Figure 2B:
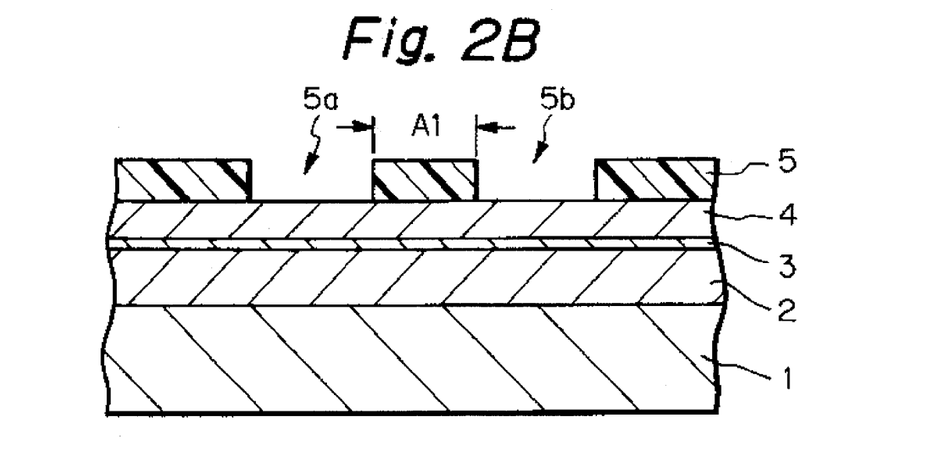

Next, referring to FIG. 2B, in the same way as shown in FIG. 1B, a photoresist layer 5 is formed on the entire surface. Then, the photoresist layer 5 is patterned by a photolithography process to create windows 5a and 5b at both sides of a light emission area A1.

Figure 2C:
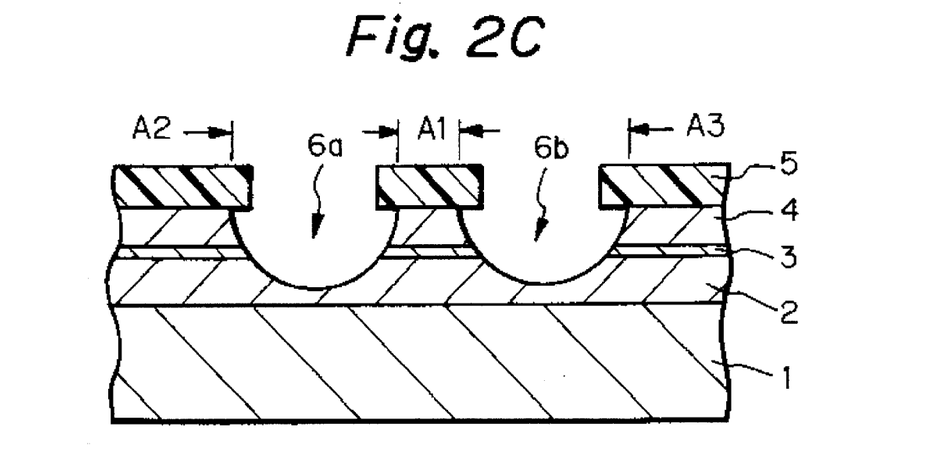
Figure 2D:
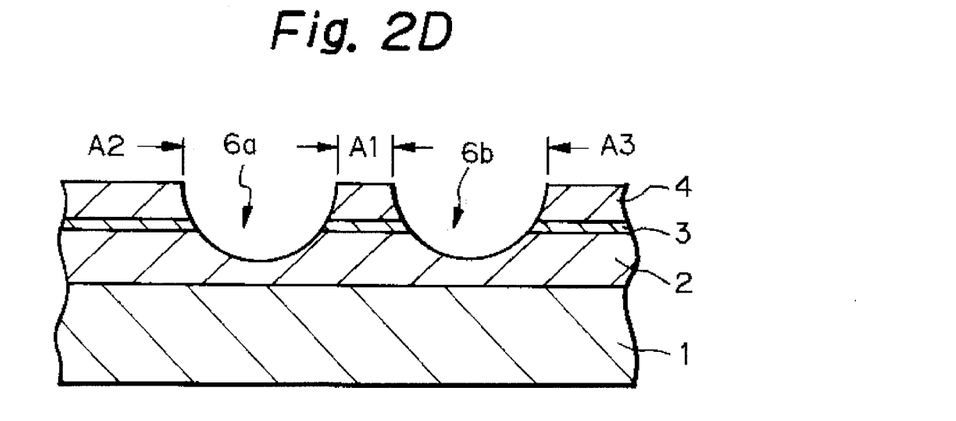

Next, referring to FIG. 2C, in the same way as shown in FIG. 1C, the P-type InP cladding layer 4, the active layer 3 and the N-type InP cladding layer 2 are etched by an etchant including $H_2SO_4$ or HCl with a mask of the patterned photoresist layer 5. As a result, striped grooves 6a and 6b are formed within the compound semiconductor crystal. Then, the photoresist layer 4 is removed by a plasma ashing or a wet process. Thus, as shown in FIG. 1D, the light emission area A1 is separated from outer edge areas A2 and A3.

Figure 2E:
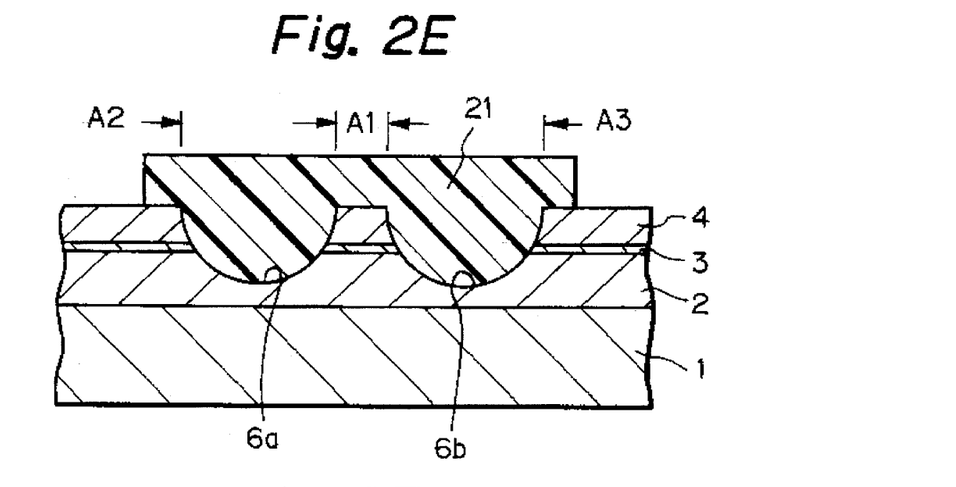

Next, referring to FIG. 2E, a photoresist layer 21 is formed. Then, the photoresist layer 21 is patterned by a photolithography process, so that the photoresist layer 21 covers the light emission area A1 and the striped grooves 6a and 6b, but does not cover the outer edge areas A2 and A3.

Figure 2F:
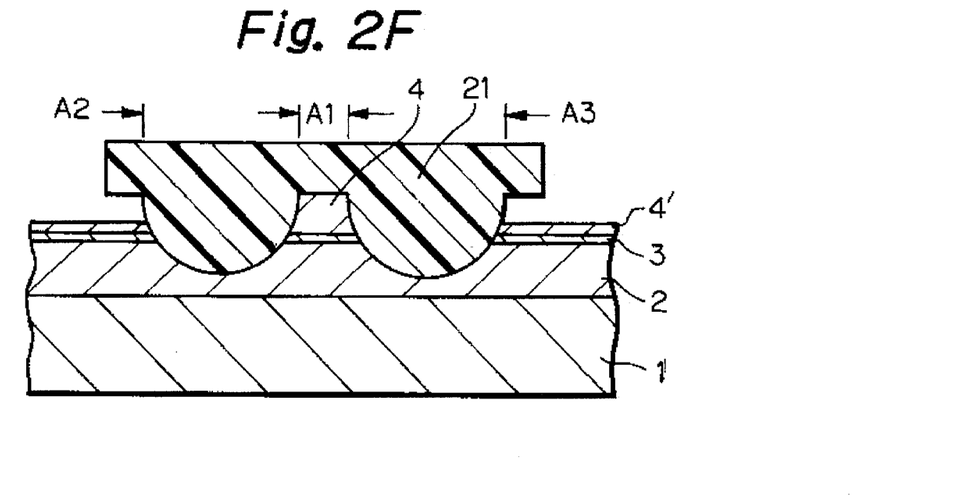
Figure 2G:
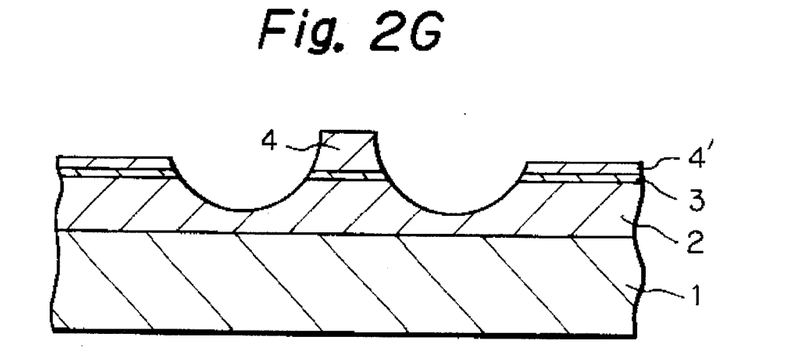

Next, referring to FIG. 2F, the P-type InP cladding layer 4 is partly etched by an etchant including $H_2SO_4$ or HCl with a mask of the patterned photoresist layer 21. As a result, the P-type InP cladding layer 4 in the outer edge areas A2 and A3 is changed to a lower P-type InP cladding layer 4'. In other words, the P-type InP cladding layer 4' at the outer edge areas A2 and A3 is lower than the P-type InP cladding layer 4 at the light emission area A1. Then, the photoresist layer 21 is removed by a plasma ashing or a wet process, as shown in FIG. 2G.

Figure 2H:
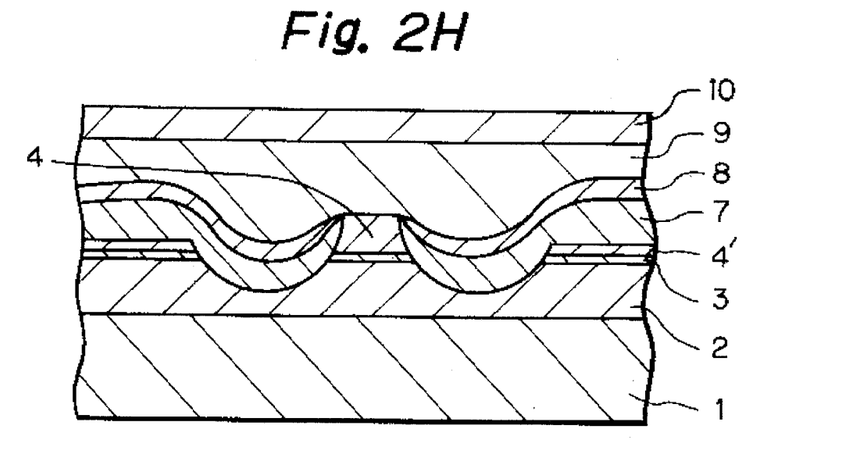

Next, referring to FIG. 2H, in the same way as shown in FIG. 1E, a P-type InP current blocking layer 7, an N-type InP current blocking layer 8, a P-type upper cladding layer 9 and a P-type InGaAsP cap layer 10 are grown by an LPE method.

Figure 2I:
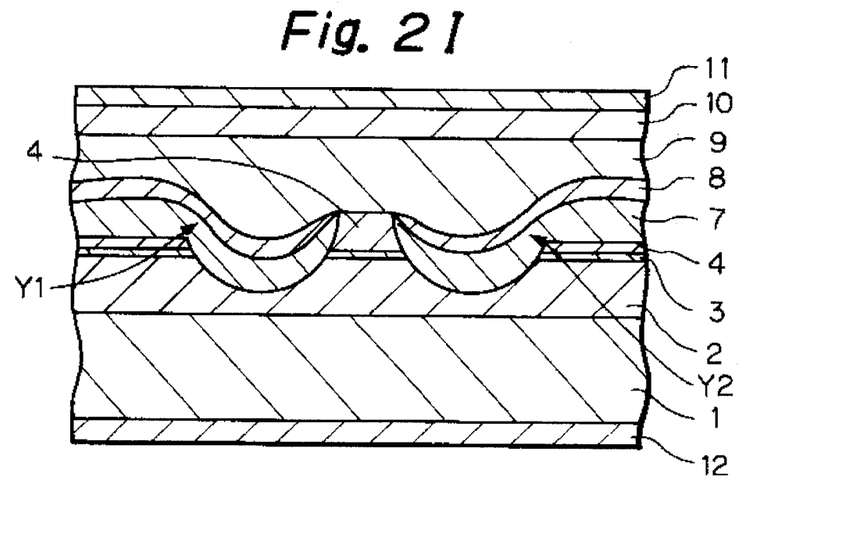

Finally, referring to FIG. 2I, in the same way as shown in FIG. 2H, a P-side electrode 11 and an N-side electrode 12 are formed on the front and back surfaces, respectively.

Thus, in the first embodiment as shown in FIGS. 2A through 2I, the P-type InP current blocking layer 7 and the N-type InP current blocking layer 8 are sufficiently thick at the outer edges of the striped grooves as indicated by arrows Y1 and Y2 in FIG. 2I. As a result, the current blocking layers 7 and 8 are not disconnected, and the resistance thereof is not reduced.

FIGS. 3A through 3I show a second embodiment of the present invention.

Figure 3A:
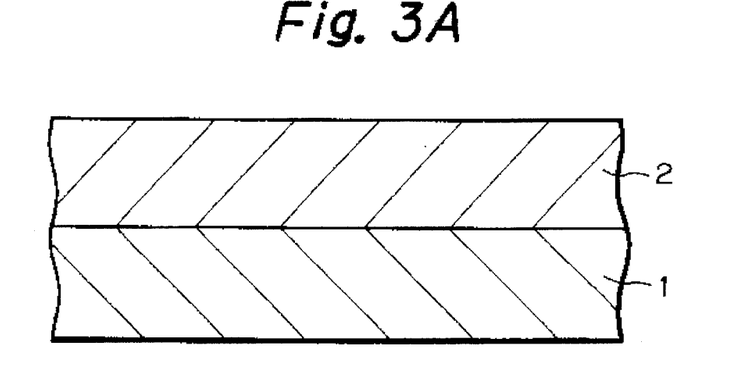
FIGS. 3A through 3I are cross-sectional views explaining a method for manufacturing a second embodiment of the semiconductor laser device according to the present invention.

First, referring to FIG. 3A, an N-type InP cladding layer 2 is formed by an LPE method on an N-type InP substrate 1. Together the N-type InP substrate 1 and the N-type InP cladding layer 2 form a compound semiconductor crystal.

Figure 3B:
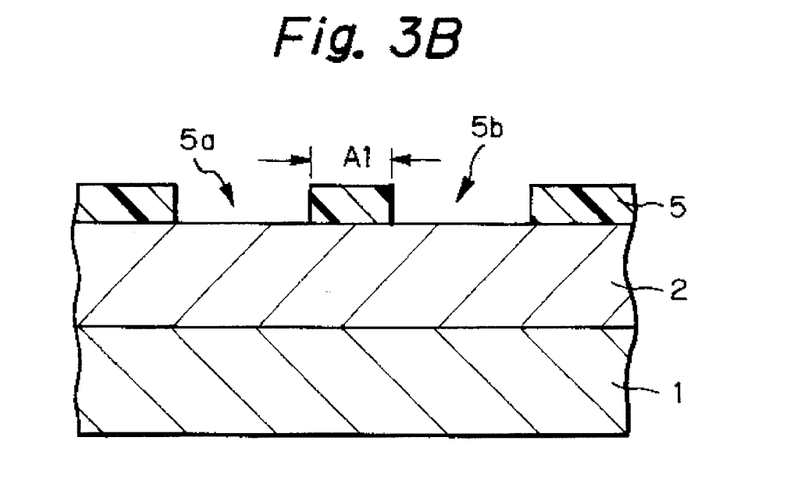

Next, referring to FIG. 3B, in the same way as in FIG. 2B, a photoresist layer 5 is formed on the entire surface. Then, the photoresist layer 5 is patterned by a photolithography process to create windows 5a and 5b at both sides of a light emission area A1.

Figure 3C:
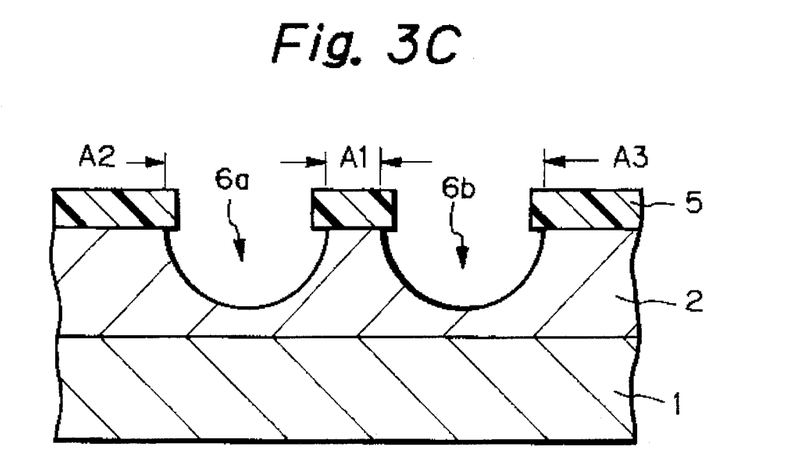
Figure 3D:
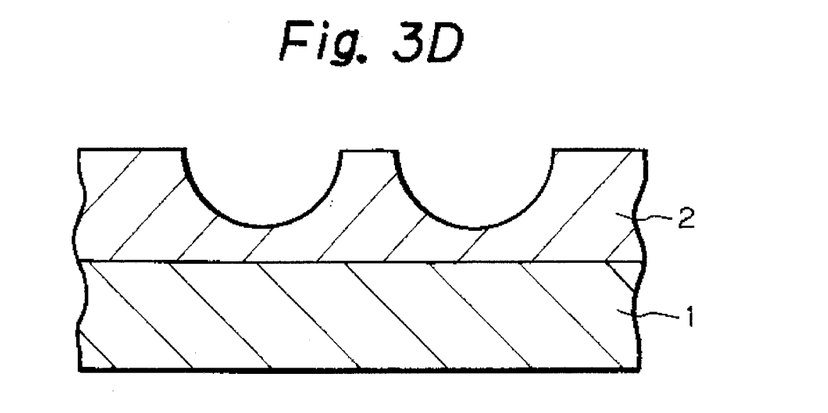

Next, referring to FIG. 3C, in a similar way to that shown in FIG. 2C, the N-type InP cladding layer 2 is etched by an etchant including $H_2SO_4$ or HCl with a mask of the patterned photoresist layer 5. As a result, striped grooves 6a and 6b are formed within the N-type InP cladding layer 2. Then, the photoresist layer 4 is removed by a plasma ashing or a wet process. Thus, as shown in FIG. 1D, the light emission area A1 is separated from outer edge areas A2 and A3.

Figure 3E:
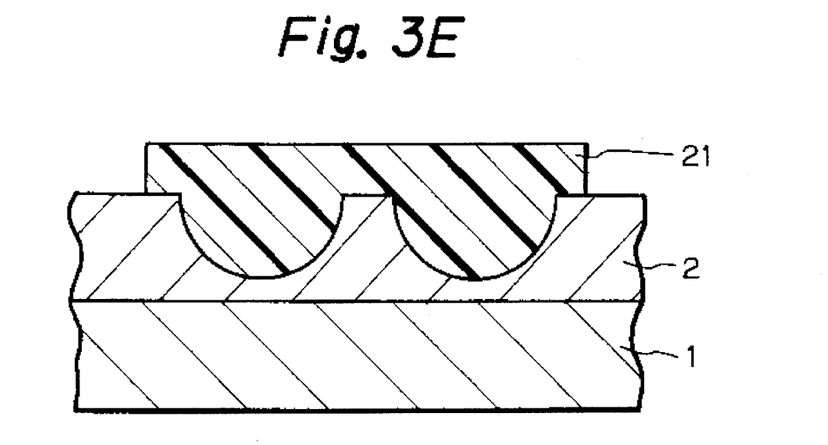

Next, referring to FIG. 3E, in the same way as shown in FIG. 2E, a photoresist layer 21 is formed. Then, the photoresist layer 21 is patterned by a photolithography process, so that the photoresist layer 21 covers the light emission area A1 and the striped grooves 6a and 6b, but does not cover the outer edge areas A2 and A3.

Figure 3F:
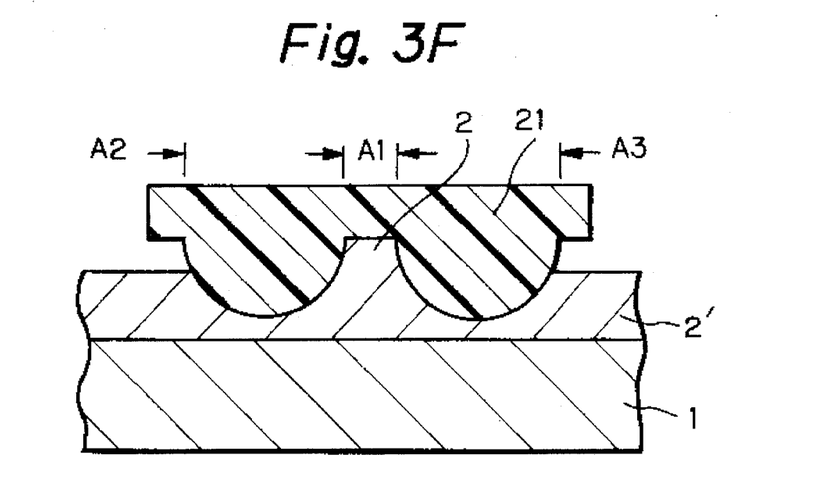
Figure 3G:
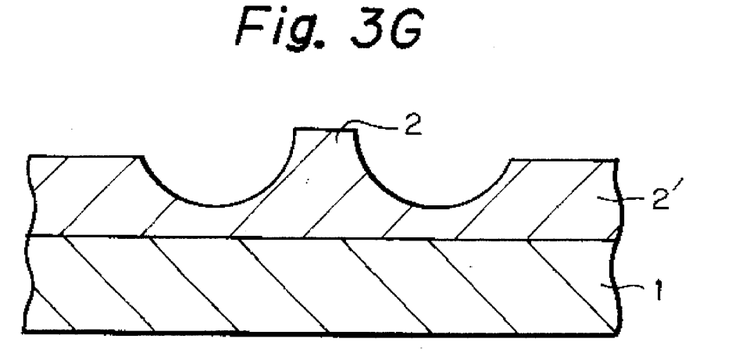

Next, referring to FIG. 3F, in a similar way to that shown in FIG. 2F, the N-type InP cladding layer 2 is partly etched by an etchant including $H_2SO_4$ or HCl with a mask of the patterned photoresist layer 21. As a result, the N-type InP cladding layer 2 in the outer edge areas A2 and A3 is changed to a lower N-type InP cladding layer 2'. In other words, the N-type InP cladding layer 2' at the outer edge areas A2 and A3 is lower than the N-type InP cladding layer 2 at the light emission area A1. Then, the photoresist layer 21 is removed by a plasma ashing or a wet process, as shown in FIG. 3G.

Figure 3H:
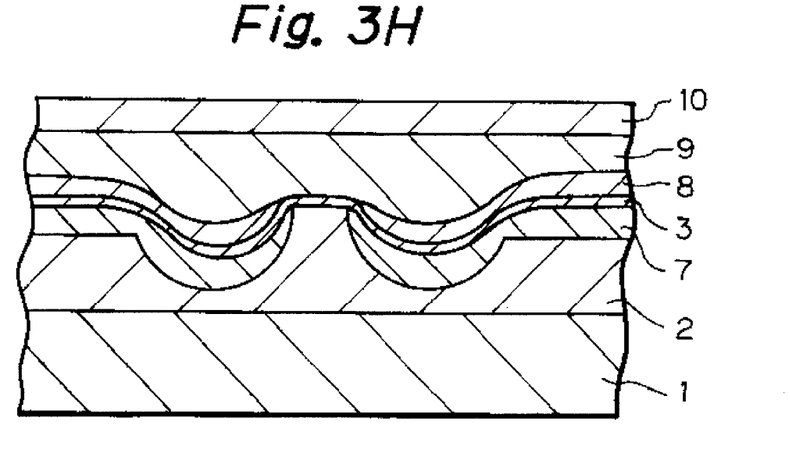

Next, referring to FIG. 3H, in a similar way to that shown in FIG. 2H, a P-type InP current blocking layer 7, an InGaAsP active layer 3, an N-type InP current blocking layer 8, a P-type upper cladding layer 9 and a P-type InGaAsP cap layer 10 are grown by an LPE method.

Figure 3I:
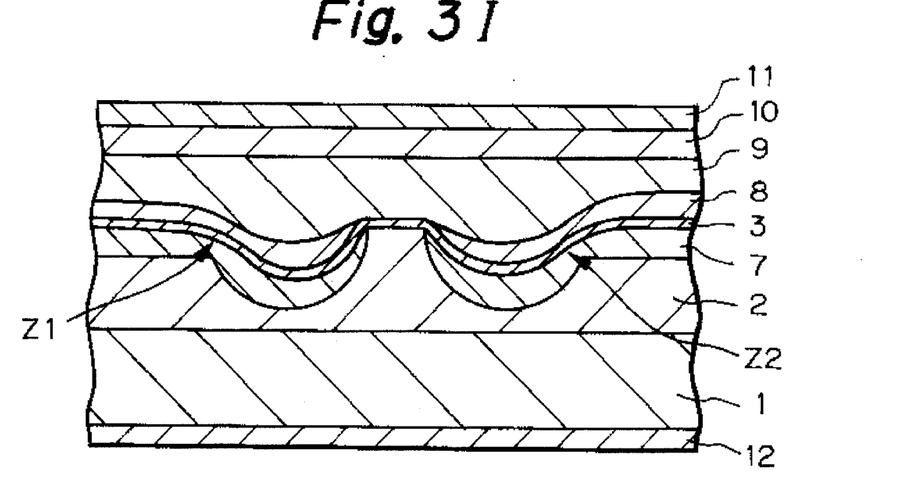

Finally, referring to FIG. 3I, in the same way as shown in FIG. 2I, a P-side electrode 11 and an N-side electrode 12 are formed on the front and back surfaces, respectively.

Thus, also in the second embodiment as shown in FIGS. 3A through 3I, the P-type InP current blocking layer 7 and the N-type InP current blocking layer 8 are sufficiently thick at the outer edges of the striped grooves as indicated by arrows Z1 and Z2 in FIG. 3I. As a result, the current blocking layers 7 and 8 are not disconnected, and the resistance thereof is not reduced.

In the above-described embodiments, a polyimid resin layer or the like can be used instead of the photoresist layer 21. Also, if the active layer is formed by a multi-quantum well (MQW) configuration, the active layer can be manufactured by a metalorganic vapor phase epitaxy (MOVPE) growth method.

As explained hereinbefore, according to the present invention, since the current blocking layers can be thick at the outer edges of the striped grooves, the current block layers are not disconnected, and the resistance thereof is not reduced, to improve the reliability of operation of semiconductor laser devices.

I claim:

1. A method for manufacturing a semiconductor laser device, comprising the steps of:

forming striped grooves in a compound semiconductor means on both sides of a light emission area thereof;

etching said compound semiconductor means on both outer sides of said striped gooves, so that said compound semiconductor means is lower at the both outer sides of said striped grooves than at said light emission area; and forming current blocking layers buried on said compound semiconductor means on the both sides of said light emission area after said compound semiconductor means is etched.

2. A method as set forth in claim 1, wherein said current blocking layer forming step forms said current blocking layers by a liquid phase epitaxial growth method.

3. A method as set forth in claim 1, wherein said compound semiconductor means comprises a compound semiconductor substrate.

4. A method as set forth in claim 1, wherein said compound semiconductor means comprises a compound semiconductor crystal element.

5. A method for manufacturing a semiconductor laser device, comprising the steps of:

forming a first cladding layer of a first conductivity type on a compound semiconductor substrate;

forming an active layer on said first cladding layer;

forming a second cladding layer of a second conductivity type opposite to said first conductivity type on said active layer;

forming striped grooves in said second cladding layer, said active layer and said first cladding layer on both sides of a light emission area;

etching said second cladding layer on both outer sides of said striped grooves, so that said second cladding layer is lower at both outer sides of said striped grooves than at said light emission area; and forming current blocking layers on said first and second cladding layers except for said light emission area.

6. A method as set forth in claim 5, wherein said current blocking layer forming step comprises the steps of:

forming a first buried layer of said second conductivity type by a liquid phase epitaxial growth method; and forming a second buried layer of said first conductivity type by said liquid phase epitaxial growth method.

7. A method for manufacturing a semiconductor laser device, comprising the steps of:

forming an N-type InP cladding layer on an N-type InP substrate;

forming an InGaAsP active layer on said N-type InP cladding layer;

forming a P-type InP cladding layer on said InGaAsP active layer;

etching said P-type InP cladding layer, said InGaAsP active layer and said N-type InP cladding layer with a first mask, so that striped grooves are formed within said P-type InP cladding layer, said InGaAsP active layer and said N-type InP cladding layer on both sides of a light emission area;

etching said P-type InP cladding layer with a second mask, so that said P-type InP cladding layer on both outer sides of said striped grooves is partly removed;

forming a buried P-type InP layer on said P-type InP cladding layer except for said light emission area and on said N-type InP cladding layer within said striped grooves; and forming a buried N-type InP layer buried in said buried P-type InP layer.

8. A method for manufacturing a semiconductor laser device, comprising the steps of:

forming striped grooves in a compound semiconductor substrate on both sides of a light emission area;

etching said compound semiconductor substrate on both outer sides of said striped grooves, so that said compound semiconductor substrate is lower at both outer sides of said striped grooves than at said light emission area;

forming a first buried current blocking layer on said compound semiconductor substrate except for said light emission area;

forming an active area on said light emission area of said compound semiconductor substrate and said first buried current blocking layer; and forming a second buried current blocking layer on said active layer except for said light emission area.

9. A method as set forth in claim 8, wherein said first buried current blocking layer is of a first conductivity type, and said second buried current blocking layer is of a second conductivity type opposite to the first conductivity type.

10. A method for manufacturing a semiconductor laser device, comprising the steps of:

forming an N-type InP cladding layer on an N-type InP substrate;

etching said N-type InP cladding layer with a first mask, so that striped grooves are formed within said N-type InP cladding layer on both sides of a light emission area;

etching said N-type InP cladding layer with a second mask, so that said-N-type InP cladding layer on both outer sides of said striped grooves is partly removed;

forming a buried P-type InP layer on said N-type InP cladding layer except for said light emission area;

forming an InGaAsP active layer on said N-type InP cladding layer and said buried P-type InP layer; and forming a buried N-type InP layer buried in said InGaAsP active layer.

* * * * *